United States Patent [19]
Kumar

[11] Patent Number: 5,963,495
[45] Date of Patent: Oct. 5, 1999

[54] DYNAMIC SENSE AMPLIFIER WITH EMBEDDED LATCH

[75] Inventor: Manoj Kumar, Austin, Tex.

[73] Assignee: International Business Machines Corporation, Armonk, N.Y.

[21] Appl. No.: 09/024,807

[22] Filed: Feb. 17, 1998

[51] Int. Cl.[6] .................................................. G11C 7/02
[52] U.S. Cl. ......................................... 365/207; 365/202
[58] Field of Search ................................... 365/207, 202, 365/208

[56] References Cited

U.S. PATENT DOCUMENTS

| | | | |
|---|---|---|---|
| 4,053,873 | 10/1977 | Freeman et al. | 340/173 |
| 4,279,023 | 7/1981 | Houghton | 365/174 |
| 4,751,681 | 6/1988 | Hashimoto | 365/207 |
| 4,843,264 | 6/1989 | Galbraith | 365/207 |
| 5,204,560 | 4/1993 | Bredin et al. | 307/530 |
| 5,526,314 | 6/1996 | Kumar | 365/207 |
| 5,783,949 | 7/1998 | Reohr et al. | 365/230.06 |

OTHER PUBLICATIONS

"A 500 MHz 1Mb On–Chip Cache Design Using Multi–Level Bit Line Sensing Scheme" by Richard Guo, et al. (1996 Symposium on VLSI Circuits Digest of Technical Papers) Month Unavailable/ 1996.

Primary Examiner—David Nelms
Assistant Examiner—Anh Phung
Attorney, Agent, or Firm—Anthony V.S. England; Russell D. Culbertson

[57] ABSTRACT

A dynamic sense amplifier (10) cooperates with an embedded latch arrangement for converting signals read from a memory cell array to digital signals. The dynamic sense amplifier (10) is connected to a complementary pair of data output lines, each associated with a data output node, and to a complementary pair of data lines from a column decoder associated with the memory cell array. The dynamic sense amplifier (10) is also connected to a sense enable line for receiving a sense enable signal, while the latch incorporated in the dynamic sense amplifier (10) is connected to a latch enable line. The dynamic sense amplifier (10) operates to quickly develop an intermediate charge state at the data output nodes in response to a read charge state on the data lines and a sense enable signal applied at the sense enable line. After developing the intermediate charge state, the latch enable signal is applied to the latch enable line to take the intermediate charge state to a final charge state at the data output nodes. This final charge state at the data output nodes produces data signals on the data output lines. The latch also operates in response to the latch enable signal to hold the charge at the data output nodes, thereby holding the data at the data output lines.

6 Claims, 2 Drawing Sheets

DYNAMIC SENSE AMPLIFIER WITH EMBEDDED LATCH

BACKGROUND OF THE INVENTION

This invention relates to electronic memory devices and more particularly to a sense amplifier for converting the output from a memory cell to a digital signal. The invention includes both a sense amplifier circuit and a method for sensing data from a memory cell and converting the data to a digital signal.

Random access memory devices comprise arrays of memory cells, each cell adapted to store one bit of data or information. A plurality of memory cells are connected together in a column by a complementary pair of conductors referred to as bit lines and the array of memory cells includes many such columns and associated bit line pairs. Each cell in a column is also connected to a conductor referred to as a word line by which the particular memory cell in the column may be selected for a read or write operation. The complementary pair of bit lines associated with each column of memory cells is connected to a write driver circuit used in writing or storing data to a selected memory cell in the column. Each complementary pair of bit lines is also connected to a column decoder circuit which enables one of the plurality of memory cell columns for a read operation. The output from the column decoder circuit comprises a single complementary pair of data lines.

The bit lines are used both to write data to a memory cell for storage in the cell and to read data previously stored in a cell. In a read operation, both bit lines are placed in an initial charge state. In this initial charge state both lines are typically charged to a supply voltage level. The memory cell selected in the read operation maintains the charge level on one bit line and corresponding data line from the column decoder, and allows the charge state on the complementary bit line and data line to decay. The full charge state on one bit line and corresponding data line and the lower charge state on the complementary bit line and data line represents binary data, either a "1" or a "0", which was previously stored in the selected memory cell. However, since the lower charge state develops gradually on the complementary bit line and data line, the signals present on the bit lines and data lines in a read operation are not true digital signals.

A sense amplifier is connected to the complementary pair of data lines for receiving the analog signal produced from a memory cell in a read operation. The sense amplifier amplifies and converts the analog signal on the data lines to a true digital signal. A differential sense amplifier produces a finite gain and develops the desired signal level relatively slowly. Since it develops the desired digital signal relatively slowly, a differential sense amplifier may recover from an error occurring on the bit line. In contrast, a dynamic sense amplifier produces an infinite gain and develops the desired digital signal level more quickly than a differential sense amplifier. Although operating faster, a dynamic sense amplifier cannot recover from an error occurring on the bit line. With either a differential sense amplifier or dynamic sense amplifier, the data or information represented by the desired digital signal must be stored to a latch circuit or other suitable arrangement to hold the data for a desired time. However, these external latch arrangements added complexity to the prior sense amplifier circuits.

U.S. Pat. No. 5,526,314 ("314 Patent") discloses a dual mode sense amplifier having an integral latch. The device disclosed in 314 Patent initially operated in a differential sense amplifier mode to sense the data present on the data lines and then switched to a dynamic sense amplifier mode. Although relatively faster than a differential sense amplifier, the dual mode sense amplifier disclosed in the 314 Patent still relied on the relatively slow differential sense amplifier operation for sensing the data on the data lines.

SUMMARY OF THE INVENTION

It is an object of the invention to provide a dynamic sense amplifier which does not require an external storage arrangement for holding the sensed data. It is also an object of the invention to provide a method for converting the charge state appearing on the data lines of a memory cell array to a desired digital signal without having to use external latches to hold the data.

These objects are accomplished in a sense amplifier which includes a dynamic sense amplifier arrangement with an embedded latch circuit. The dynamic sense amplifier is coupled to complementary data output lines through two data output nodes and is also coupled to complementary data lines from a column decoder. A sense enable line is also connected to the dynamic sense amplifier for turning on the sense amplifier with a sense enable signal. According to the invention, the sense amplifier quickly develops an intermediate charge state at the data output nodes when data is present on the data lines and the sense enable signal (SE), preferably a high going signal, is applied to the sense enable line. This intermediate charge state comprises a low going charge on one of the data output nodes and a relatively higher charge state on the opposite data output node. The embedded latch arrangement, under the control of a preferably high going latch enable signal (LE), then takes the intermediate charge state quickly to a final output charge state at the data output nodes and holds the final output charge state to produce the desired digital signal output. The dynamic sense amplifier and embedded latch circuit according to the invention develops both the final output charge state and the intermediate charge state very quickly.

The dynamic sense amplifier includes a first set of switches coupled to the data output nodes leading to the data output lines. A second set of switches is coupled to the data lines, and to the first set of switches. The second set of switches is also connected to the sense enable line for receiving the sense enable signal. The latch includes a third set of switches coupled to the first set of switches and connected to a latch enable line to receive the latch enable signal.

In operation, the complementary data output nodes are placed in an initial charge state by suitable precharge means. A precharge signal causes the precharge means to produce the desired precharge and then disables the precharge means for the remainder of the sense amplifier operation.

With the data output nodes precharged, a selected memory cell associated with the memory array produces a differential charge state or read charge state on its associated bit lines and on the data lines. Once the selected memory cell develops the suitable read charge state on the data lines, the preferably high going sense enable signal is applied to the sense enable line. The sense enable signal operates a sense control switch of the second set of switches and forces the complementary data output nodes to rapidly develop the intermediate charge state. After developing the intermediate charge state on the data output nodes, the latch enable signal is applied to the latch enable line to turn on a latch control switch associated with the third set of switches. With the latch control switch on, the third set of switches rapidly brings the charge state at the data output nodes from the intermediate charge state to the final output charge state. An inverter associated with each data output node inverts and conditions the signals to produce the desired digital signals on the data output lines.

The dynamic sense amplifier according to the invention has the advantage of operating rapidly to produce the desired final charge state from the read charge state appearing on the data lines. Thus the disclosed sense amplifier facilitates faster operation than an differential sense amplifier or a dual mode sense amplifier such as that shown in the 314 Patent. Also, the embedded latch in the dynamic sense amplifier obviates the need for an additional circuit for holding the output of the sense amplifier to produce the desired digital signals.

These and other objects, advantages, and features of the invention will be apparent from the following description of the preferred embodiments, considered along with the accompanying drawings.

DESCRIPTION OF THE PREFERRED EMBODIMENTS

Figure 1:
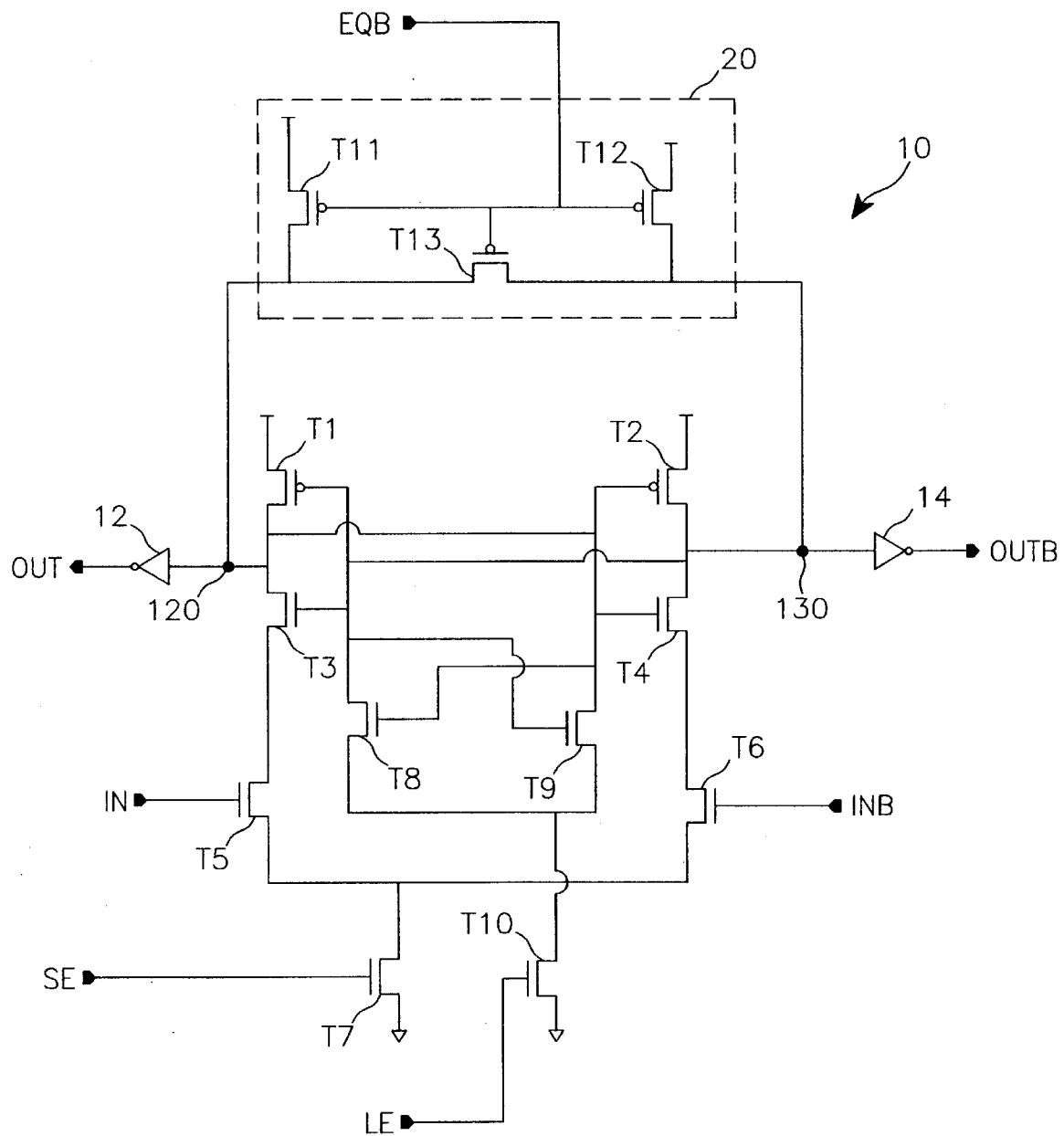
FIG. 1 is a schematic diagram of a dynamic sense amplifier embodying the principles of the invention.

FIG. 1 illustrates a dynamic sense amplifier 10 embodying the principles of the invention used in random access memory (RAM). The dynamic sense amplifier 10 is connected to complementary data output lines OUT and OUTB and complementary data lines IN and INB. The data lines IN and INB are from a column decoder associated with the RAM. Since the memory cell array and column decoder portion of the RAM are well-known in the field and do not form part of the present invention, the memory cells, bit lines, and column decoder are not illustrated in the figures. The sense amplifier 10 amplifies and converts the signals appearing on the data lines IN and INB during a read operation to produce a true digital signal at the complementary data output lines OUT and OUTB. The true digital signal comprises a logical "high" voltage level on one of the data output lines and a logical "low" voltage level on the opposite data output line.

The dynamic sense amplifier 10 includes transistors or switches T1, T2, T3, T4, T5, T6, and T7. A first set of transistors, comprising transistors T1, T2, T3, and T4, is coupled to the data output nodes shown at reference numerals 120 and 130 in FIG. 1. The signals appearing at the data output nodes 120 and 130 are inverted and conditioned with inverters 12 and 14, respectively, to produce the signals at the data output lines OUT and OUTB. The dynamic sense amplifier 10 also includes a second set of switches or transistors comprising transistors T5, T6, and T7. This second set of transistors is coupled to the first set of transistors, to the data input lines IN and INB, and to a sense enable line SE.

In the illustrated form of the invention, transistors T1 and T2 comprise P channel MOSFET devices. Transistors T3 and T4 comprise N channel MOSFET devices. The source-drain current path of transistor T1 connects node 120 to supply voltage $V_{dd}$, and the drain-source current path of transistor T3 connects node 120 to the second set of switches, T5, T6, and T7. Similarly, the source-drain current path of transistor T2 connects node 130 to the supply voltage $V_{dd}$, while the drain-source current path of transistor T4 connects node 130 to the second set of switches. The gates of transistors T1 and T3 are connected to node 130 while the gates of transistors T2 and T4 are connected to node 120. Thus, transistors T1 and T3 are arranged as an inverter circuit having its output connected to node 120, while transistors T2 and T4 are arranged as an inverter circuit having its output connected to node 130. These two inverter circuits are cross-coupled so that the output of one is applied to the input of the other.

In the illustrated form of the invention, transistors T5, T6, and T7 each comprise N channel MOSFET devices. The gate of transistor T5 is connected to the data line IN while the gate of transistor T6 is connected to the complementary data line INB. Transistor T7 comprises a sense control transistor having a relatively large drain-source current path and having its gate connected to the sense enable line SE. The drain-source current path of transistor T5 provides a current path from node 120 to ground through transistor T7. Similarly, the drain-source current path of transistor T6 provides a current path from node 130 to ground through transistor T7.

The embedded latch includes a third set of switches or transistors, comprising transistors T8, T9, and T10, coupled to the first set of switches T1, T2, T3, and T4. Transistor T10 comprises a latch control transistor having a relatively large drainsource current path and having its gate connected to a latch enable line LE. Transistor T8 has its drain-source current path connecting node 130 to ground through transistor T10. Similarly, transistor T9 has its drain-source current path connecting node 120 to ground through transistor T10. The gate of transistor T8 is connected to node 120, while the gate of transistor T9 is connected to node 130.

The dynamic sense amplifier 10 according to the invention further includes a precharge circuit 20 connected to receive a precharge signal at precharge line EQB. The precharge circuit 20 includes transistors T11, T12, and T13. Each of these precharge transistors in the illustrated form of the invention comprises a P channel MOSFET device.

Figure 2:
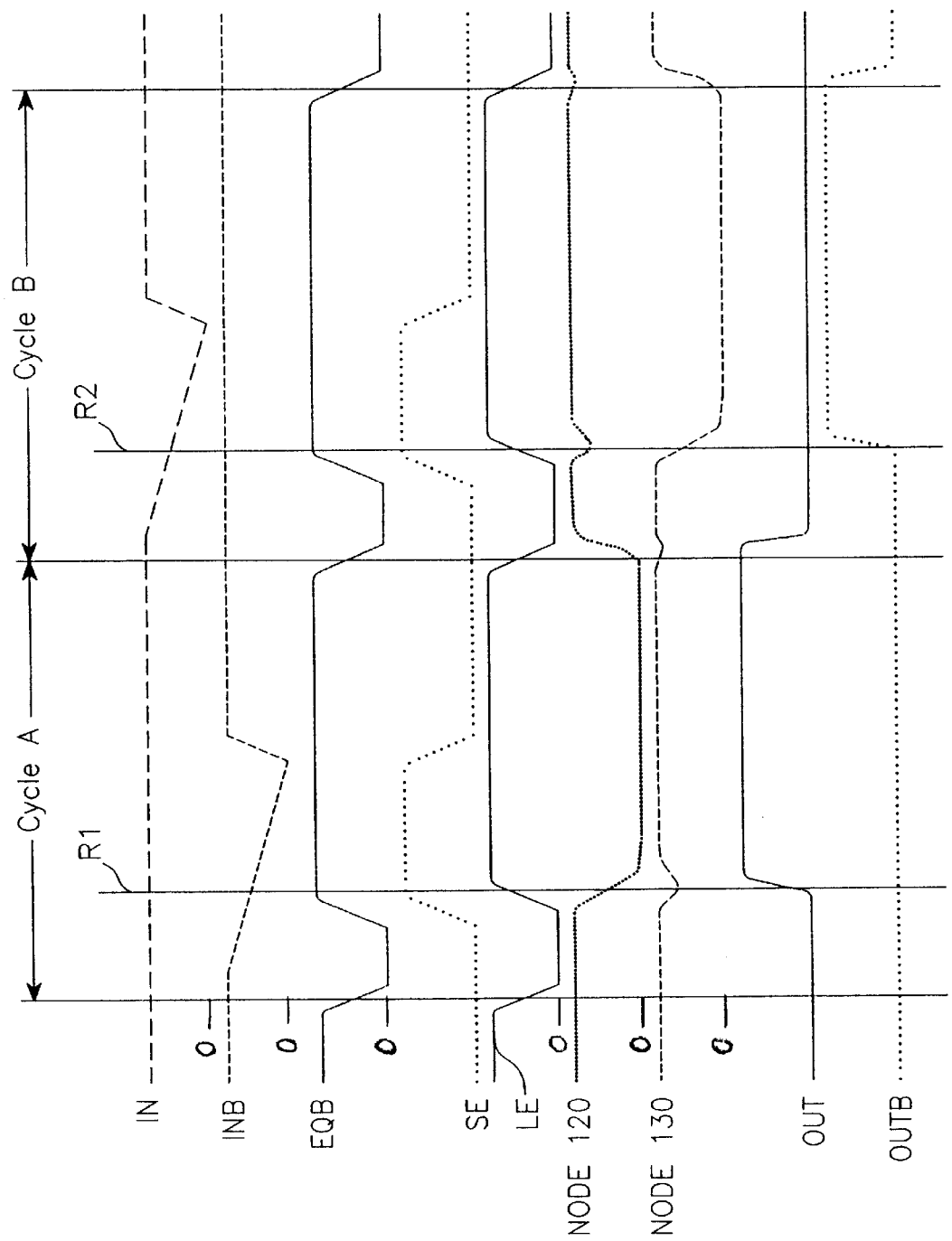
FIG. 2 is a timing chart, depicting the timing relationship between signals produced and used by the dynamic sense amplifier shown in FIG. 1.

The operation of the dynamic sense amplifier 10 may be described with reference to FIG. 1 and to the timing chart shown in FIG. 2. FIG. 2 shows two complete cycles of operation, cycle A and cycle B, both beginning with the precharge signal at precharge line EQB. Cycle A and cycle B illustrate opposite data states read from the data lines IN and INB.

Referring to cycle A in FIG. 2, initially the precharge circuit 20 charges both complementary data output nodes 120 and 130 to supply voltage level $V_{dd}$. The illustrated precharge signal comprises a "low" signal at EQB which causes each precharged transistor T11, T12, and T13 to conduct. When the precharge transistors T11, T12, and T13 conduct, node 120 and node 130 rapidly equalize at the supply voltage level $V_{dd}$. When the signal at EQB goes "high" the precharge transistors T11, T12, and T13 are each turned off and the high EQB signal keeps the precharge transistors off during the rest of cycle A. In the initial precharged condition, the charge on nodes 120 and 130 turn off transistors T1 and T2, and turn on transistors T3, T4, T8, and T9.

The dynamic sense amplifier 10 operates on a read charge state appearing on the data lines IN and INB. Referring to FIG. 2, a read charge state is shown on IN and INB at reference line R1 in cycle A and at reference line R2 in cycle B. The read charge state comprises a differential charge state on the data lines resulting as the selected memory cell (not shown) holds one data line at a "high" charge state and allows the charge on the opposite data line to decay. In cycle A the higher voltage signal is maintained on data line IN while the signal at data line INB is allowed to decay. The higher voltage signal at data line IN in cycle A causes the drain-source current path of transistor T5 to be more conductive than the drain-source current path of transistor T6.

With the desired read charge state developed on the data lines IN and INB, a sense enable signal SE goes "high" causing the relatively large sense control transistor T7 to conduct, and allowing the charge at node 120 to drop quickly through transistors T3, T5, and T7. The charge at node 130 also begins to drop through transistors T4, T6, and T7. However, the lower voltage signal at INB in cycle A causes the charge state at node 130 to change more slowly than 120. Furthermore, the lower charge state rapidly developing at node 120 is applied to the gates of transistors T2 and T4 increasing the resistance at T4 and decreasing the resistance at T2 to help maintain the charge state at node 130. Thus the sense enable signal at sense enable line SE in the presence of the read charge state on the data lines IN and INB causes an intermediate charge state to quickly develop at output nodes 120 and 130. In this intermediate charge state in cycle A the output node 120 is being pulled low while output node 130 maintains a higher charge level. Under this condition, with the sense enable signal applied at SE, the output node 120 would go all the way to ground while the node 130 would return to $V_{dd}$ even in the absence of the latch enable signal.

After the sense enable signal at SE operates to produce the intermediate charge state at the data output nodes 120 and 130, the latch enable signal, comprising a "high" signal at latch enable line LE, turns on the relatively large latch control transistor T10. With the higher voltage signal at node 130 in the intermediate charge state shown in cycle A, transistor T9 conducts to rapidly pull data output node 120 all the way to ground through transistor T10 in response to the latch enable signal. The low signal at node 120 is applied to the gates of transistors T2, T4, and T8 causing transistor T2 to conduct to pull the charge on node 130 back up to the supply voltage level $V_{dd}$. This charge state with one data output node at ground and the other at $V_{dd}$ represents the final output charge state. The invertors 12 and 14 condition the signals at nodes 120 and 130 to produce digital signals at the data output lines OUT and OUTB.

Data sensed at the data lines IN and INB is driven to the complementary data output lines OUT and OUTB as long as the latch enable signal is applied to the gate of transistor T10 through line LE. During the time that the latch enable signal is applied at LE, the sense enable signal at SE is forced low and the data lines IN and INB are precharged to $V_{dd}$ for the next new cycle. Once the latch enable signal is removed, another cycle begins with the low precharge signal at EQB once again precharging the complementary data output nodes, node 120 and node 130 for the next read operation.

According to the invention, the final output charge state produced in response to the latch enable signal, and the intermediate charge state produced in response to the sense enable signal, both develop very rapidly. The intermediate charge state develops rapidly due to the first set of transistors T1, T2, T3, and T4 and the relatively large sense control transistor T7. The final output charge state develops rapidly due to conduction through T7 and T10, and to the cooperation of transistors T1, T2, T3, T4, T8, and T9, and the relatively large size of T10.

It will be noted that the intermediate charge state is not a steady state, but rather a low going charge state on one data output node (120 in cycle A) and a relatively higher charge state on the opposite data output node. Even without the transistors T8, T9, and T10 and the latch enable signal at LE, the sense enable signal would cause the sense amplifier 10 to pull the lower data output node all the way to ground while the opposite data output node would return to $V_{dd}$. However, the latch enable signal at LE not only latches the data but also operates to increase the rate at which the low going data output node goes to ground and the higher data output node returns to $V_{dd}$.

In cycle B shown in FIG. 2, the sense amplifier 10 receives a "high" signal at data line INB and the lower signal at data line IN. The sense enable signal at SE produces an intermediate charge state in which data output node 130 is pulled rapidly lower through transistors T4, T6, and T7. At the same time, data output node 120 maintains a higher charge state due to the relatively greater resistance at transistors T3 and T5 and relatively lower resistance at transistor T1.

The latch enable signal at LE in cycle B develops the final output charge state on the data output nodes 120 and 130 with the charge at node 130 dropping rapidly to ground through transistors T8 and T10. The low signal at node 130 turns off transistor T3 and turns on transistor T1 to pull node 120 back to $V_{dd}$ in the final output charge state shown in cycle B. Again, the invertors 12 and 14 invert and condition the signals at the data output nodes 120 and 130 to produce the signal at data output lines OUT and OUTB.

The above-described preferred embodiments are intended to illustrate the principles of the invention, but not limit the scope of the invention. Various other embodiments and modifications to these preferred embodiments may be made by those skilled in the art without departing from the scope of the following claims. For example, a different precharge arrangement may be employed as well as different signal conditioning devices for the data output lines. Also, the logic utilized in the circuit may be modified within the scope of the invention to facilitate the use of different transistors and opposite states for the sense enable and latch enable signals as well as precharge signal.

I claim:

1. A dynamic sense amplifier comprising:
   (a) a first set of switches comprising first and second inverter circuits, an output of the first inverter circuit being connected to a first data output node and to an input of the second inverter circuit, an output of the second inverter circuit being connected to a second data output node and to an input of the first inverter circuit;
   (b) a second set of switches coupled to a sense enable line, to a complementary pair of data lines, and to the first set of switches, the second set of switches producing an intermediate charge state at the first and second data output nodes in response to a sense enable signal at the sense enable line and a read charge state at the complementary pair of data lines; and
   (c) a latch coupled to the first set of switches and to a latch enable line, the latch for taking the intermediate charge state at the first and second data output nodes to a final output charge state in response to a latch enable signal at the latch enable line, and for holding the final output charge state at the data output nodes in response to the latch enable signal.

2. The dynamic sense amplifier of claim 1 further comprising:
   (a) a first output inverter circuit coupling the first data output node to a first data output line, and a second output inverter circuit coupling the second data output node to a second data output line.

3. The dynamic sense amplifier of claim 1 further comprising:
 (a) precharge means connected to the first and second data output nodes for precharging the data output nodes to a precharge voltage level in response to a precharge signal occurring between latch enable signals.

4. The dynamic sense amplifier of claim 1 wherein the latch comprises:
 (a) a latch control transistor having a gate connected to the latch enable line;
 (b) a first latch transistor having a drain-source current path connecting the second data output node to ground through the latch control transistor, and having a gate connected to the first data output node; and
 (c) a second latch transistor having a drain-source current path connecting the first data output node to ground through the latch control transistor, and having a gate connected to the second data output node.

5. A method of producing a digital data output signal from a read charge state on a complementary pair of data lines associated with an array of memory cells, the method comprising the steps of:
 (a) dynamically amplifying signals on a complementary pair of data input lines in response to a sense enable signal, thereby producing an intermediate charge state at a complementary pair of data output nodes; and
 (b) developing and latching a final charge state at the complementary pair of data output nodes in response to a latch enable signal and the intermediate charge state.

6. The method of claim 5 further comprising the step of:
 (a) precharging the complementary pair of data output nodes in response to a precharge signal occurring prior to the latch enable signal.

* * * * *